(12) United States Patent
Miyamoto et al.

(10) Patent No.: US 7,078,316 B2
(45) Date of Patent: Jul. 18, 2006

(54) SUBSTRATE JOINING APPARATUS (75) Inventors: Saburo Miyamoto, Mie-ken (JP); Yukitoshi Hase, Mie-ken (JP); Masaru Irie, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 167 days.

(21) Appl. No.: 10/875,165

(22) Filed: Jun. 25, 2004

(65) Prior Publication Data

US 2005/0014345 A1    Jan. 20, 2005

(30) Foreign Application Priority Data

Jul. 14, 2003    (JP)  ............................. 2003-274047

(51) Int. Cl.
*H01L 21/30*    (2006.01)
(52) U.S. Cl. ...................................... 438/455; 118/715
(58) Field of Classification Search ................ 438/455; 118/715
See application file for complete search history.

(56) References Cited

U.S. PATENT DOCUMENTS 6,806,499 B1 * 10/2004 Yamazaki et al. ............. 257/72
2001/0026349 A1 * 10/2001 Furukawa et al. .......... 349/187

FOREIGN PATENT DOCUMENTS

JP    2000-349136 A1    12/2000

* cited by examiner

*Primary Examiner*—Thanh Nguyen
(74) *Attorney, Agent, or Firm*—Rader, Fishman & Grauer PLLC (57) ABSTRACT A joining roller rolls on the surface of a reinforcing substrate held by a center and side latch claws so as to be close and opposite to an wafer placed and held on a holding table in the condition that an adhesive sheet is adhered on the surface, whereby joining proceeds. As the joining roller rolls, both of the latch claws oscillate downward and the latch claws themselves move down while keeping the bend of the reinforcing substrate nearly constant, and retract when the joining roller approaches the latch claws.

10 Claims, 6 Drawing Sheets

SUBSTRATE JOINING APPARATUS

BACKGROUND OF THE INVENTION (1) Field of the Invention

The present invention relates to a method and an apparatus for joining two substrates with an adhesive sheet interposed therebetween.

(2) Description of the Related Art

In a conventional semiconductor wafer (hereinafter, simply referred to as "wafer"), a number of elements are formed on the wafer, the back side of the wafer is ground in a back grinding process. After that, the resultant wafer is cut into each element in a dicing process. It is recent trend, however, to thin the wafer to as small as 100 µm to 50 µm, or even about 25 µm for conforming to the requirement of high density packaging.

Such a wafer that is made thinner in the back grinding process is not only brittle but also has distortion; therefore, its handlability becomes considerably poor.

In view of this, there has been suggested and practiced an approach to enhance a wafer by joining the wafer and a glass plate or the like with an adhesive sheet interposed therebetween.

To be more specific, a wafer having an adhesive tape previously adhered to the upper face is mounted and fixed on a holding stage. At a position above this wafer, a base formed of a glass plate or the like (substrate in the present invention) is latched and held at an upper end of a base supporting part in an inclined position. Then, a press roller moves on the surface of the base supported in inclined position and, also, the base supporting part moves downward according to the movement of the press roller, so that the base is joined to the semiconductor wafer (see JP-A 2000-349136.)

In the above-described conventional substrate joining apparatus, since the base for reinforcement is latched and held at the upper end of the cylindrical base supporting part surrounding the wafer, the reinforcing base has inevitably a larger diameter than the wafer. For this reason, the outer circumference of the base partly protrudes from the outer circumference of the wafer that has been reinforced by joining the base. This protrusion of base hinders the subsequent process of the wafer and makes the apparatus bulky.

SUMMARY OF THE INVENTION

The present invention is devised in consideration of the aforementioned circumstances, and it is a primary object of the present invention to provide a substrate joining method and a substrate joining apparatus capable of joining a substrate such as semiconductor wafer to a reinforcing substrate which is the same as or smaller than the substrate in diameter, and miniaturizing the apparatus.

In order to achieve the object, the present invention employs the following configurations.

The substrate joining method for joining two substrates to each other with an adhesive sheet interposed therebetween comprises the following step:

a step of holding a second substrate at a plurality of points by holding means so as to oppose to a first substrate held in a predetermined posture and moving a joining roller on the surface of the second substrate, thereby joining these substrates to each other via an adhesive sheet that has been preliminarily adhered to one of the substrates and, also, appropriately retracting the holding means from the path of the joining roller with the movement of the joining roller.

According to the substrate joining method of the present invention, it is possible to continuously move the joining roller without hindered by the holding means by retracting the holding means from the path of the joining roller when the joining roller that is moving for achieving joining approaches the holding points of the second substrate. Eventually, the holding means is retracted from the path of the joining roller at all of the holding positions. This enables a second substrate which is the same or smaller than the first substrate in diameter to be held and joined, and the second substrate can be joined without partly protruding from the first substrate, so that the subsequent process can be conducted in the state where there is no protrusion. This also contributes to miniaturize the apparatus.

In the present invention, it is preferred that the holding means is moved down with the movement of the joining roller.

According to this method, in the step of joining the second substrate to the first substrate with the movement of the joining roller on the surface of the second substrate while bending the second substrate from its one end, the holding means of the second substrate is moved down so that the bend of the second substrate falls within an acceptable range. In this manner, it is possible to join the second substrate to the first substrate while preventing the second substrate to be joined from being excessively bent and damaged.

Also according to the present invention, it is preferred that appropriate resistance is given to the downward movement of the holding means.

According to this method, when the holing means moves down in accordance with the inclination of the second substrate, appropriate resistance is given to the downward movement. This prevents the holding means from moving down more than necessary due to inertia or the like. Since the downward movement accompanies appropriate resistance, oscillation will not occur more than necessary due to inertia or the like and high supporting accuracy of the second substrate is achieved, which is effective for improving the joining accuracy.

Furthermore, in the present invention, it is preferred that the joining roller rolls at a circumferential velocity that is equal to a joining forward movement velocity of the joining roller.

According to this method, it is possible to move the joining roller without exerting any external power in the roller moving direction onto the surface of the second substrate. Therefore, it is possible to improve the joining accuracy of these substrates.

In the present invention, it is preferred that the first substrate and the second substrate are joined to each other under reduced pressures.

According to this method, it is possible to join the first substrate and the second substrate to each other while preventing bubbles from getting contained in the joining surface. Therefore, it is possible to realize the joining process with little occurrence of defective products.

Preferably, at least one of the first and second substrates is a semiconductor wafer, for example, one of the first and second substrates is a stainless sheet and the other is a semiconductor wafer.

Also, in order to achieve the above object, the present invention employs the following constitutions.

A substrate joining apparatus for joining two substrates to each other comprises:

a holding table on which a first substrate is mounted and held;

holding means for holding a second substrate at a plurality of points so as to oppose to the first substrate on the holding table;

a joining roller which is moved on the surface of the second substrate in the state where an adhesive sheet is adhered to one of the substrates, thereby joining the first substrate and the second substrate to each other; and driving means for retracting the holding means from the path of the joining roller in accordance with movement of the joining roller.

According to the substrate joining apparatus of the present invention, as the joining roller moves on the surface of the second substrate, the second substrate is joined onto the first substrate while it is bent from its one end. In this case, when the joining roller approaches a point where the second substrate is held, the holding means at that point is retracted from the path of the joining roller, so that the joining roller can continuously move without hindered by the holding means. Eventually, holding means of all holding points are retracted from the path of the joining roller. In this manner, it is possible to desirably realize the first method invention.

Furthermore, in the present invention, it is preferred that the driving means is configured to move up and down the holding means in accordance with movement of the joining roller.

According to this configuration, in the course that second substrate is joined with the first substrate while being bent from its one end, as the joining roller moves on the surface of the second substrate, the holding means of the second substrate is moved up and down so that the bend of the second substrate falls within an acceptable range. Therefore, it is possible to join the second substrate to the first substrate while preventing the second substrate to be joined from being excessively bent and damaged.

Also in the present invention, it is preferred that the holding means is made up of a center latch claw that latches a center end edge of roller forward direction in the periphery of the second substrate and a pair of side latch claws that latch the end edge on the right and left sides with respect to the roller forward direction in the periphery of the second substrate, and at least one of the center latch claw and the side latch claws is allowed to oscillate about a lateral fulcrum crossing at right angles with the roller forward direction.

According to this configuration, the second substrate before subjected to joining is placed so as to oppose to the first substrate at a certain distance while being latched at three points by the center latch claw and the right and left side latch claws. When the joining operation starts, the joining roller pushes one end portion of the second substrate against one end portion of the first substrate and then the joining roller moves on the surface of the second substrate, whereby the second substrate is joined to the first substrate while being bent from its one end.

In this case, since the second substrate is bent and deformed within an acceptable range by the movement of the joining roller, the portion of the substrate that has not been joined is inclined to rise in the roller forward direction. In respect of this, if the side latch claws are allowed to oscillate by latching the side latch claws to the second substrate while keeping a large width in the circumferential direction of the substrate, the side latch claws can oscillate so as to conform with the inclination of the substrate.

Also, if the center latch claw is allowed to oscillate, the side latch claws can oscillate so as to conform with the inclination of the substrate when the joining roller approaches the center latch claw.

That is, it is possible to latch and support the second substrate having inclination due to bending deformation caused by the joining operation in such a posture that conforms with the inclination, and hence it is possible to prevent the substrate from being damaged at the latched and held points.

Also, in the present invention, it is preferred that appropriate resistance is given to rotation of the center latch claw and the side latch claws.

According to this configuration, since appropriate resistance is given to oscillation when the side latch claws or the center latch claw oscillate in conformance with the inclination of the second substrate, it is possible to prevent the latch claws from oscillating more than necessary due to inertia or the like. Since appropriate resistance is exerted on the oscillation, oscillation more than necessary due to inertia or the like does not occur and high supporting accuracy of the second substrate is achieved, which is effective for improving the joining accuracy.

In the present invention, it is preferred that the holding means is made up of an adsorption nozzle that adsorbs to and holds the surface on the side of center end edge in the roller forward direction in the periphery of the second substrate and a pair of adsorption nozzles that adsorb to and hold the end edge sides of the right and left sides with respect to the roller forward direction in the periphery of the second substrate, and at least one of the center adsorption nozzle and the side adsorption nozzles is moved down.

According to this configuration, the second substrate before joining is placed so as to oppose to the first substrate at a certain distance while adsorbed at three points by the adsorption nozzles. When the joining operation starts, the joining roller pushes one end portion of the second substrate against one end portion of the first substrate and then the joining roller moves on the surface of the second substrate, whereby the second substrate is joined onto the first substrate while being bent from its one end.

In this case, the second substrate is bent and deformed within an acceptable range by the movement of the joining roller, and the portion of the substrate that has not been joined is inclined to rise in the roller forward direction. In respect of this, if the adsorption nozzles are able to move down, the side adsorption nozzles can move down so as to conform with the inclination of the substrate.

Also, if the center adsorption nozzle is able to move down, the side adsorption nozzles can move down so as to conform with the inclination of the substrate when the joining roller approaches the center adsorption nozzle.

That is, it is possible to adsorb and hold the second substrate which inclines due to bending deformation caused by the joining operation in such a posture that conforms with the inclination, and hence it is possible to prevent the substrate from being damaged at the adsorbed and held points.

Also, in the present invention, it is preferred that appropriate resistance is given to downward movement of the center latch claw and the side latch claws.

According to this configuration, since appropriate resistance is given to downward movement when the side adsorption nozzles or the center adsorption nozzle move down in conformance with the inclination of the second substrate, it is possible to prevent the adsorption nozzles from moving down more than necessary due to inertia or the like. Since appropriate resistance is exerted on the downward movement, downward movement more than necessary due to inertia or the like does not occur and high supporting accuracy of the second substrate is achieved, which is effective for improving the joining accuracy.

In the present invention, it is preferred that the joining roller is driven at a circumferential velocity that is equal to the joining forward movement velocity.

According to this configuration, it is possible to move the joining roller without exerting any external power of the roller moving direction on the surface of the second substrate. Therefore, it is possible to improve the joining accuracy of these substrates.

In the present invention, it is preferred that heating means is incorporated in the holding table.

According to this configuration, since the heating means is incorporated in the holding means, it is possible to soften the adhesive of the adhesive sheet adhered to the substrate, and hence join the substrates with high efficiency.

In the present invention, it is preferred that the holding table, the holding means and the joining roller are accommodated in a decompression chamber.

According to this configuration, it is possible to join the first substrate and the second substrate to each other while preventing bubbles from getting contained in the joining surface. Therefore, it is possible to realize the joining process with little occurrence of defective products.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of the present invention will now be explained with reference to the drawings.

Figure 1:
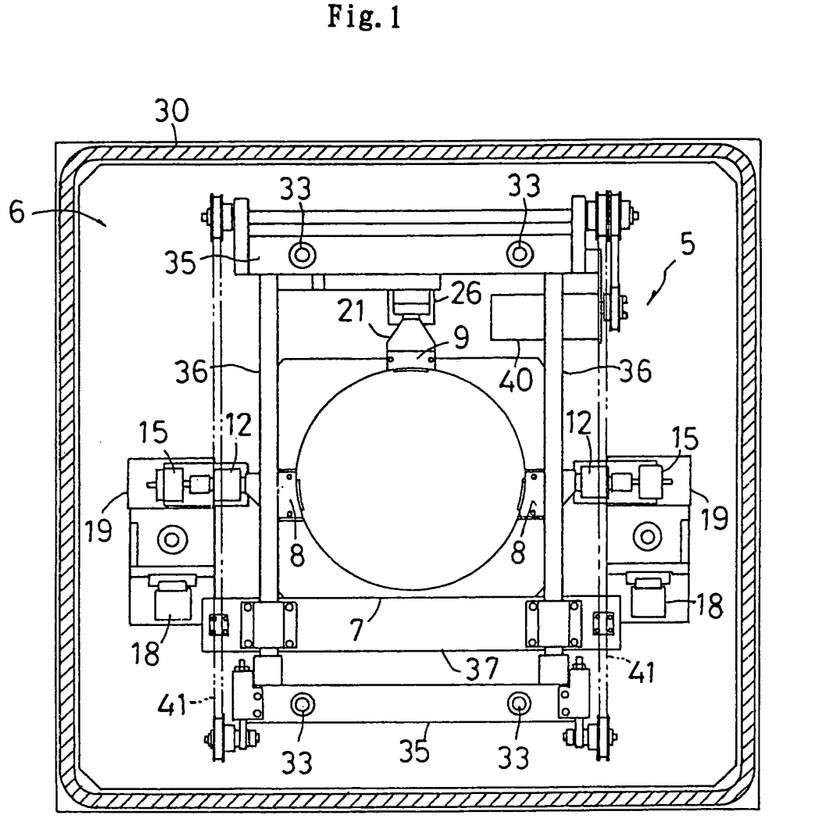
FIG. 1 is a plan view of a substrate joining apparatus of the present invention.
Figure 2:
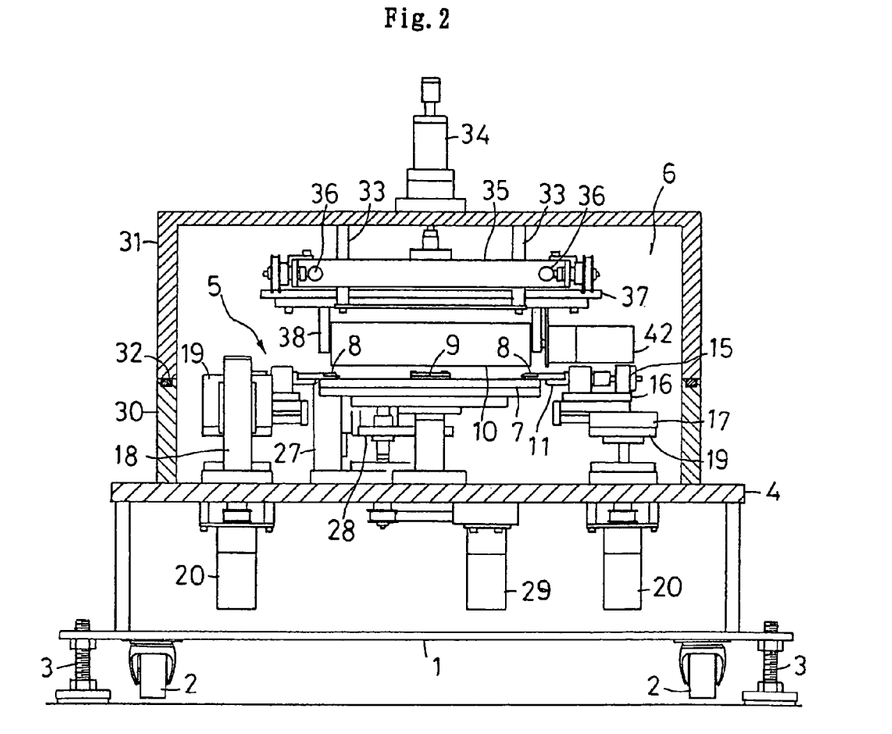
FIG. 2 is a front view of a substrate joining apparatus of the present invention.

FIG. 1 is a plan view of a substrate joining apparatus for implementing a substrate joining method of the present invention, and FIG. 2 is a front view thereof.

Figure 4:
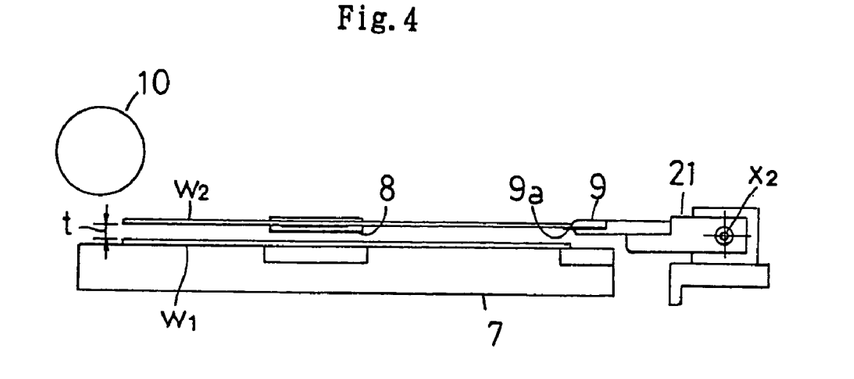
FIGS. 4 to 9 illustrate procedures of a joining process.

As shown in FIG. 4, the substrate joining apparatus according to the present embodiment is configured to join a reinforcing substrate $w_2$ formed of glass plate serving as a second substrate on a semiconductor wafer (hereinafter, simply referred to as "wafer") $w_1$ serving as a first substrate. Basically, as shown in FIGS. 1 and 2, a stage frame 4 is disposed on the upper face of a base frame 1 equipped with caster wheels 2 for movement and stands 3 for fixing, and a joining mechanism 5 and an openable/closable decompression chamber 6 accommodating the same are disposed on the stage frame 4.

The joining mechanism 5 includes a holding table 7 of vacuum adsorption type on which the wafer $w_1$ is horizontally mounted and held, a pair of right and left side latch claws 8 and a center latch claw 9 that latch and hold the periphery of the reinforcing substrate $w_2$ at three points, a joining roller 10 that is horizontally hung in the right and left direction and moves fore-and-aft direction, and driving means for these. Concrete structures of each part will be explained below.

Figure 3:
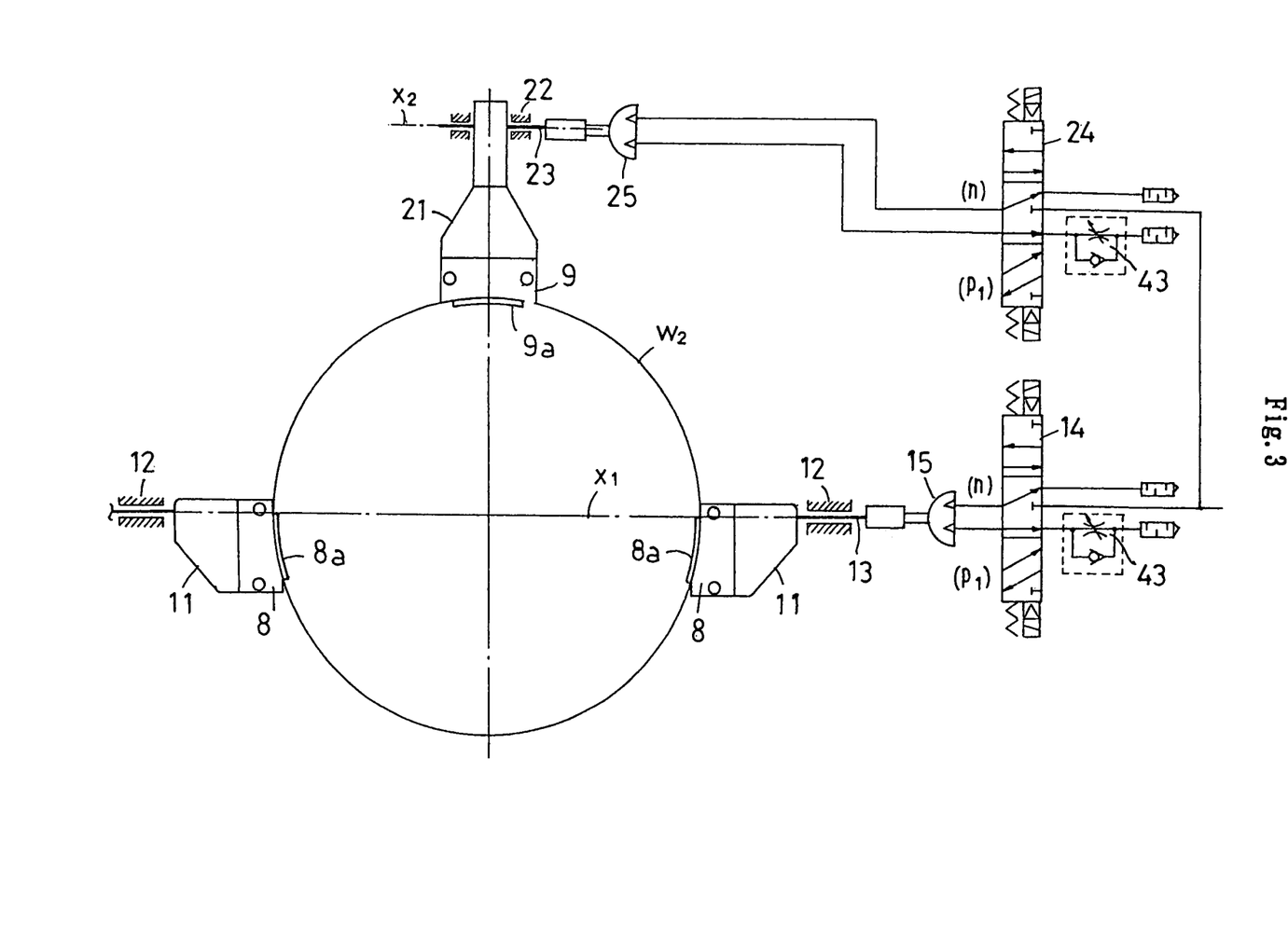
FIG. 3 is a plan view of a main part.

As shown in FIG. 3, the side latch claws 8 are bolted to a holder 11 in a detachable manner, and are formed stepwise at their tip ends with a latch portion 8a of a partial arc shape that receives and latches a right and left opposing portion in the periphery of the reinforcing substrate $w_2$ from beneath. This latch portion 8a is formed over a certain range in the circumferential direction from right and left diagonal positions passing through the center of the substrate to a starting end side of the joining (lower side in FIG. 3).

The holder 11 itself is born on a bearing bracket 12 so as to be able to oscillate about a horizontal lateral axial center $x_1$ passing through the center of the substrate in plane view, and a supporting axis 13 rotatably supported by the bearing bracket 12 is connected to an air-driven rotary actuator 15 via an electromagnetic valve 14. The holder 11 is allowed to oscillate only from the horizontal posture to the front down posture, and when the electromagnetic valve 14 is in a neutral position "n" as illustrated, the rotary actuator 15 can freely rotate. When the electromagnetic valve 14 is switched to a first position p1, the rotary actuator 15 drives the holder 11 into the front rising direction, so that the holder 11 and the side latch claws 8 attached thereto are forcedly held in the horizontal posture which is an oscillation limit in the front rising direction.

Again referring to FIGS. 1 and 2, the bearing bracket 12 bearing the holder 11 of either right or left side latch claw 8 and the rotary actuator 15 are mounted on a supporting stage 16, and the supporting stage 16 is designed to be laterally movable in the horizontal direction via a linear lateral driving mechanism 17 driven in a screw feeding manner by an air cylinder or a pulse motor. In other words, the right and left side latch claws 8 are reciprocable between the substrate holding position and the retracted position retracted outside the substrate.

Furthermore, the linear lateral driving mechanism 17 itself is mounted on an elevator stage 19 which is able to move up and down along a rail 18 erected on the stage frame 4, and by moving up and down the elevator stage 19 in a screw feeding manner by means of a pulse motor 20, it is possible to move up and down the right and the left side latch claws 8 respectively as desired.

The center latch claw 9 is also bolted to a holder 21 in a detachable manner as shown in FIG. 3, and formed stepwise at its tip end with a latch portion 9a of a partial arc shape that receives and latches an edge end on the joining end side of the reinforcing substrate $W_2$ from beneath over a certain range in the circumferential direction.

The holder 21 itself is born on a bearing bracket 22 so as to be able to oscillate about a horizontal lateral axial center $x_2$ in plane view, and a supporting axis 23 rotatably supported by the bearing bracket 22 is connected to an air-driven rotary actuator 25 via an electromagnetic valve 24. The holder 21 is allowed to oscillate only from the horizontal posture to the front down position. When the electromagnetic valve 24 is in a neutral position "n" as illustrated, the rotary actuator 25 can freely rotate, and when the electromagnetic valve 24 is switched to a first position $p_1$, the rotary actuator 25 drives the holder 21 into the front rising direction, so that the holder 21 and the center latch claw 9 attached thereto are forcedly held in the horizontal posture which is the oscillation limit in the front rising direction.

The bearing bracket 22 bearing the holder 21 of the center latch claw 9 and the rotary actuator 25 are also mounted on a supporting stage 26, and the supporting stage 26 is designed to be movable in the fore-and-aft direction via a linear fore-and-aft driving mechanism (not shown) driven in a screw feeding manner by an air cylinder or a pulse motor. In other words, the center latch claw 9 is reciprocable between the substrate holding position and the retracted position retracted outside the substrate.

Furthermore, as seen from FIG. 2, the linear fore-and-aft driving mechanism itself is mounted on an elevator stage 28 which is able to move up and down along a rail 27 erected on the stage frame 4, and by moving up and down the elevator stage 28 in a screw feeding manner by means of a pulse motor 29, it is possible to move up and down the center latch claw 9 as desired.

The decompression chamber 6 is made up of a fixed peripheral wall 30 of rectangular cylinder shape provided on the stage frame 4 and a cover case 31 attached to the fixed peripheral wall 30 via a hinge (not shown) so as to be able to open/close by oscillation in the vertical direction. Thus, the internal pressure of the decompression chamber 6 can be reduced by actuating a vacuum pump (not shown). The entire circumference of the upper end of the fixed peripheral wall 30 is attached with a seal 32 for ensuring closeness of the interior by close contact with the entire circumference of the lower end of the closed cover case 31.

The joining roller 10 is provided in the cover case 31 so as to be movable in the fore-and-aft direction and in the up and down direction. To be more specific, the cover case 31 is attached with an elevator frame 35 which is slidable in the up and down direction via four guide axes 33 and is driven to move up and down by the air cylinder 34. That is, as to the joining roller 10, a movable stage 37 is attached so as to be movable in the fore-and-aft direction along a pair of right and left guide axes 36 that are hung by elevator frame 35 horizontally in the fore-and-aft direction; and the joining roller 10 is rotatably supported horizontally in the right and left direction by a holder 38 that is connected by bolting to the bottom face of the movable stage 37 in a detachable manner.

On the right and left sides of the elevator frame 35, a non-slip type belt 41 that is to be rotationally driven by the motor 40 is horizontally wound in the fore-and-aft direction. To this belt 41 is connected the movable stage 37, and by driving the movable stage 37 to move horizontally in the fore-and-aft direction by rotating the belt 41 forward or backward, the joining roller 10 is moved horizontally in the fore-and-aft direction.

The holder 38 of the joining roller 10 is provided with a motor 42 for driving the joining roller 10, the motor 42 auto-rotating while moving the joining roller 10 in the fore-and-aft direction.

Joining operations of the substrate joining apparatus having the above configurations will be explained below based on FIGS. 4 to 9.

(1) First, the decompression chamber 6 is opened by lifting the cover case 31, a wafer $w_1$ before subjected to back grinding is aligned and held by adsorption on the holding table 7 in such a posture that the surface is upside. On the surface of the wafer $w_1$, a separable adhesive sheet which will lose its adhesiveness upon heating is preliminarily stuck together with a separator. When the mounting of the substrate to the holding table 7 completes, the separator on the surface is separated to make the adhesive surface exposed.

At this point of time, the joining roller 10 is on standby at the starting point located upside and front side, while the side latch claws 8 and the center latch claw 9 are on standby in horizontal posture at the height of the starting point where they are retracted outside the substrate at a predetermined height.

(2) Next, the side latch claws 8 and the center latch claw 9 are caused to move horizontally to predetermined positions on the center side of the substrate that are determined based on preliminarily input information in accordance with the diameter of the reinforcing substrate $w_2$, where the reinforcing substrate $w_2$ is horizontally latched and held, supported at three points along the widths of the latch portions 8a, 9a of the side latch claws 8 and the center latch claw 9.

(3) Upon completion of the substrate mounting process as described above, the cover case 31 is closed to seal the decompression chamber 6, after which the air is discharged to reduce the internal pressure to not more than 65 KPa (500 mmHg).

(4) Upon completion of the decompression, a joining starting instruction is issued to start a joining operation.

(5) In response to the joining instruction, the side latch claws 8 and the center latch claw 9 are moved down so that the latched and held reinforcing substrate $w_2$ is moved down until a distance t with the wafer $w_1$ reaches a predetermined amount (for example, 1 mm), as shown in FIG. 4.

Figure 5:
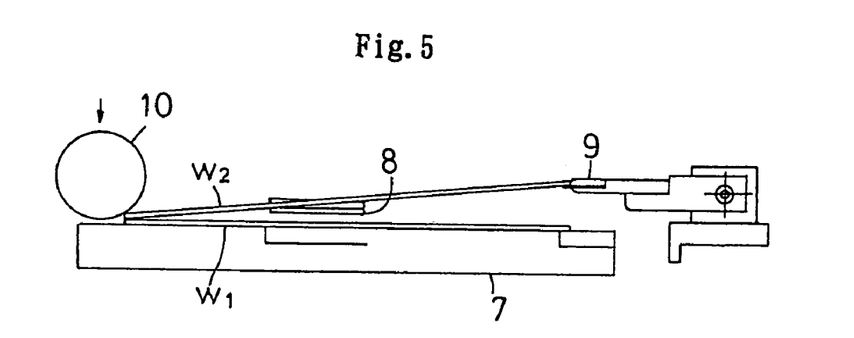

(6) Next, as shown in FIG. 5, the joining roller 10 is moved down so as to push down the front end of the reinforcing substrate $w_2$ until it comes into contact with the front end of the wafer $w_1$.

Figure 6:
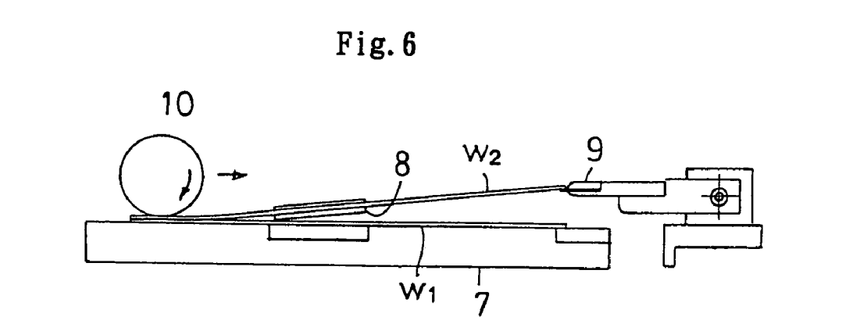

(7) Thereafter, as shown in FIG. 6, by moving the joining roller 10 frontward on the reinforcing substrate $w_2$ while driven to rotate at the same height, the reinforcing substrate $w_2$ is gradually joined to the wafer $w_1$ from its front end while being deformed to bend. In this case, the driving speed of rotation is controlled so that the circumferential velocity of the joining roller 10 which is driven to rotate coincides with the forward movement velocity of the roller, so that the trailing force toward the surface direction is prevented from acting on the reinforcing substrate $w_2$.

In addition, as the joining roller 10 moves forward, the side latch claws 8 and the center latch claw 9 are controlled to gradually move down based on a program designated in advance, and the bend of the reinforcing substrate $w_2$ is kept within an acceptable range.

(8) In an early stage of the joining, the rotary actuators 15 and 25 for controlling postures of the latch claws are supplied with air to forcedly hold the side latch claws 8 and the center latch claw 9 in the horizontal posture which is the oscillation limit. However, as the joining roller 10 moves forward to reach a predetermined position, the electromagnetic valves 14 and 24 are switched from the first position $p_1$ to the neutral position n to allow the rotary actuators 15 and 25 freely rotate. In this condition, under the influence of the external forces exerted from the bending and inclining reinforcing substrate $w_2$ to the side latch claws 8 and the center latch claw 9, the side latch claws 8 and the center latch claw 9 oscillate about the fulcrums $x_1$ and $x_2$ so as to conform with the inclination of the reinforcing substrate $w_2$. Accordingly, it is possible to prevent the stress from concentrating at the latch points of the reinforcing substrate $w_2$ to inflict damage.

However, as shown in FIG. 3, in the air discharge path from the rotary actuators 15 and 25 when the side latch claws 8 and the center latch claw 9 oscillate in a manner to conform with the inclination of the substrate, a variable diaphragm 43 utilizing a needle valve is incorporated so that appropriate resistance are exerted on the air discharge.

Therefore, immediately after the electromagnetic valves 14 and 24 are switched from the first position $p_1$ to the neutral position n, the inertia rotation when the rotary actuators 15, 25 rotate by external forces is suppressed. Therefore, it is possible to prevent occurrence of the situation that the side latch claws 8 and the center latch claw 9 oscillate more than necessary and damage the latch portions of the substrate.

Figure 7:
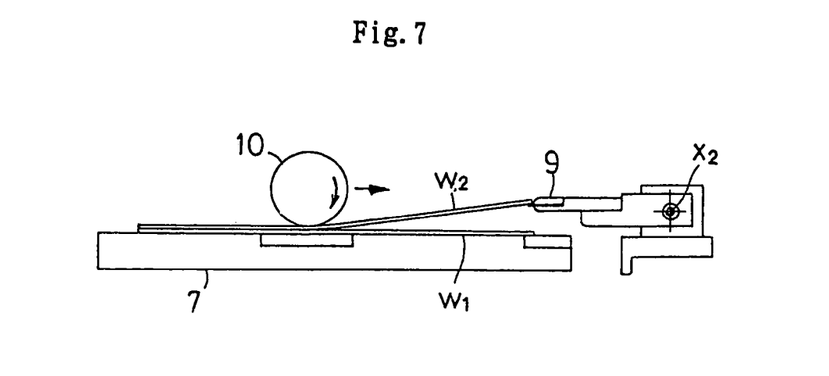
Figure 8:
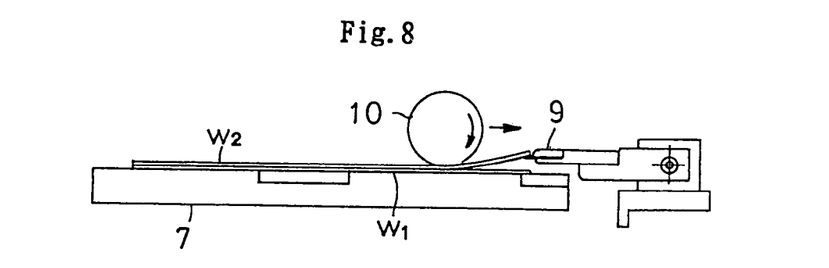
Figure 11:
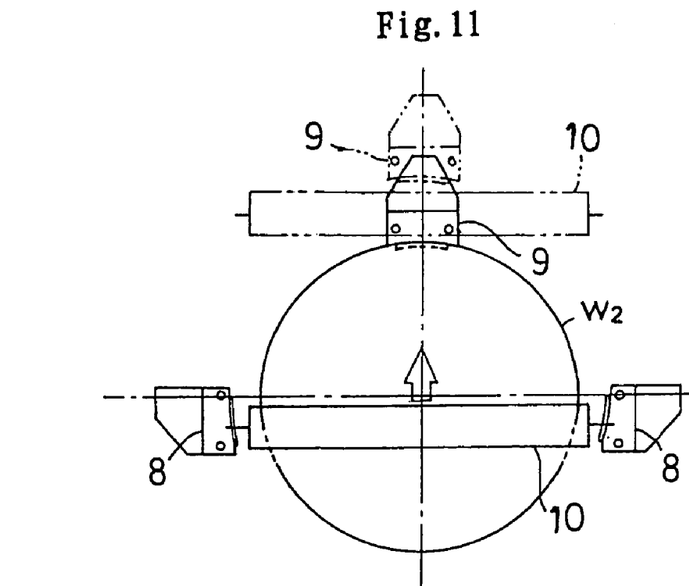
FIG. 11 is a plan view illustrating relationship between joining operation and latch claws.

(9) As shown in FIGS. 7 and 11, when the joining roller 10 moves to a predetermined position which is close to the side latch claw 8, the side latch claw 8 retracts outside the substrate so as not to inhibit movement of the joining roller 10.

Figure 9:
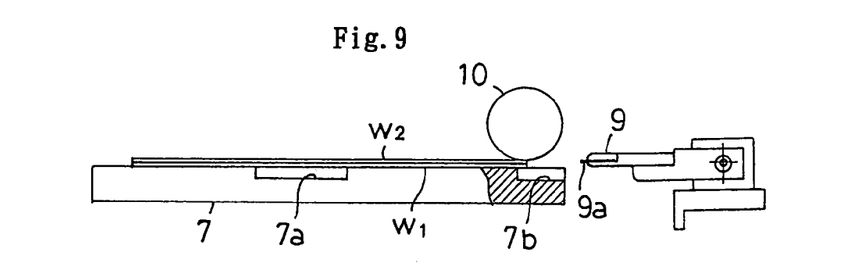
Figure 10:
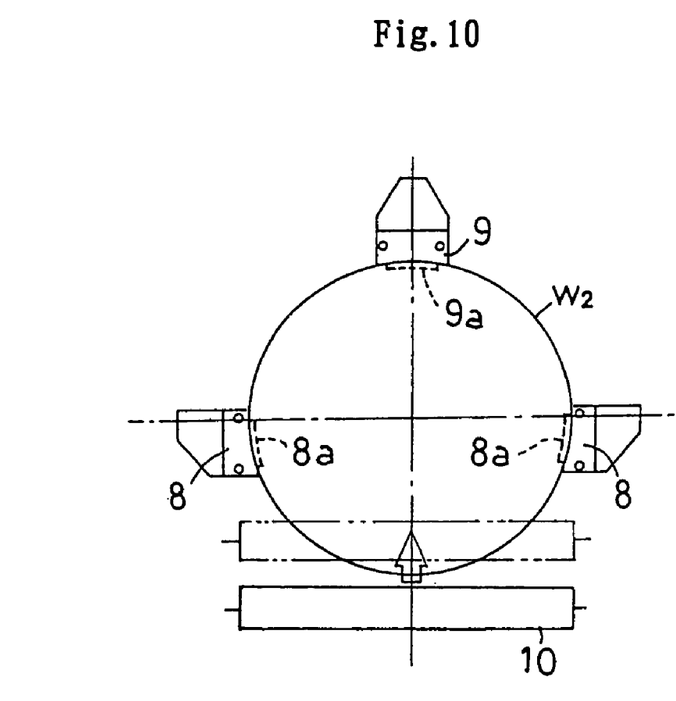
FIG. 10 is a plan view illustrating relationship between joining operation and latch claws.

(10) As the joining proceeds near the end of the termination of the substrate, as shown in FIG. 9, also the center latch claw 9 retracts outside the substrate to allow the joining roller 10 to move toward the termination of the substrate to complete the joining.

(11) Upon completion of the joining, the joining roller 10 moves up and returns to the original position, the decompression chamber 6 is ventilated to the atmospheric pressure, thereafter, the cover case 31 is opened and the wafer $w_1$ to which the reinforcing substrate $w_2$ is joined is taken out.

This is the end of the one cycle of joining operation. The cycle of operation is then repeated.

In the above joining apparatus, if the diameter of the substrate changes, the holding table 7, the side latch claws 8, the center latch claw 9 and the joining roller 10 are also replaced by suitable ones.

Although the forward movement velocity of the joining roller 10 may be usually constant, the area where the roller moves may be separated into a plurality of sections, and the forward movement velocity may be changed for each section.

In the above embodiment, the case where the reinforcing substrate $w_2$ having the same diameter as the wafer $w_1$ is joined was taken as an example, the same operation applies to the case where a reinforcing substrate $w_2$ having a slightly smaller diameter than the wafer $w_1$ is joined. Also a reinforcing substrate $w_2$ having a larger diameter than the wafer $w_1$ may be joined and, in this case, the side latch claws 8 and the center latch claw 9 may be moved down so as to sink into notch recesses 7a, 7b formed near the circumference of the holding table 7 rather than retracting the side latch claws 8 and the center latch claw 9 outside the substrate.

Not limited to the above embodiment, the present invention may be practiced in the following variants.

(1) As a reinforcing substrate $w_2$ to be joined to the wafer $w_1$, any materials having large rigidity such as stainless sheet can be used besides the glass substrate. Furthermore, the present invention may be applied to not only the semiconductor wafer but also to various kinds of work to be subjected to thinning process.

(2) In the above embodiment, the reinforcing substrate $w_2$ was held by the center and the side latch claws 8 and 9. However, in addition to this, the surface of the reinforcing substrate $w_2$ may be held by adsorption by a plurality of adsorption nozzles. In this case, the adsorption nozzles may be intermittently or continuously moved down to a predetermined position in accordance with the bend of the wafer $w_1$ generated with the movement of the joining roller 10 and may be retracted above the reinforcing substrate $w_2$ as is necessary.

(3) In the above embodiment, the joining roller 10 is auto-rotated by the motor 42. However, the joining roller 10 may roll on the surface of the reinforcing substrate $w_2$ following the fore-and-aft horizontal movement of the movable stage 37 of the reinforcing substrate $w_2$ without driven by auto-rotation of the motor 42.

(4) An adhesive sheet may be adhered in advance to the reinforcing substrate $w_2$ to be joined.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate joining apparatus for joining two substrates to each other, the apparatus comprising:
   a holding table on which a first substrate is mounted and held;
   holding means for holding a circumferential part of a second substrate at a plurality of points so as to oppose to the first substrate on the holding table;
   a joining roller which is moved on the surface of the second substrate in the state where an adhesive sheet is adhered to one of the substrates, thereby joining the first substrate and the second substrate to each other; and
   driving means for, when the joining roller comes close to each of the holding means in accordance with movement of the joining roller, causing the each holding means to release a hold on the second substrate in sequence, and retracting the each holding means outward from the second substrate deviating from the path of the joining roller.

2. The substrate joining apparatus according to claim 1, wherein
   the driving means is configured to move up/down the holding means in accordance with movement of the joining roller.

3. The substrate joining apparatus according to claim 1, wherein
   the joining roller is driven at the same circumferential velocity as the joining forward movement velocity.

4. The substrate joining apparatus according to claim 1, wherein
   heating means is incorporated in the holding table.

5. The substrate joining apparatus according to claim 1, wherein
   the holding table, the holding means and the joining roller are accommodated in a decompression chamber.

6. The substrate joining apparatus according to claim 1, wherein one of the first and second substrates is a stainless sheet, and the other is a semiconductor wafer.

7. A substrate joining apparatus for joining two substrates to each other, the apparatus comprising:
   a holding table on which a first substrate is mounted and held;
   holding means for holding a second substrate at a plurality of points so as to oppose to the first substrate on the holding table;
   a joining roller which is moved on the surface of the second substrate in the state where an adhesive sheet is adhered to one of the substrates, thereby joining the first substrate and the second substrate to each other; and
   driving means for retracting the holding means from the path of the joining roller in accordance with movement of the joining roller, wherein
   the holding means is made up of a center latch claw that latches a center end edge of roller forward direction in the periphery of the second substrate and a pair of side latch claws that latch the end edge on the right and left sides with respect to the roller forward direction in the periphery of the second substrate, and at least one of the center latch claw and the side latch claws is allowed to oscillate about a lateral fulcrum crossing at right angles with the roller forward direction.

8. The substrate joining apparatus according to claim 7, wherein appropriate resistance is given to rotation of the center latch claw and the side latch claws.

9. A substrate joining apparatus for joining two substrates to each other, the apparatus comprising:

a holding table on which a first substrate is mounted and held;

holding means for holding a second substrate at a plurality of points so as to oppose to the first substrate on the holding table;

a joining roller which is moved on the surface of the second substrate in the state where an adhesive sheet is adhered to one of the substrates, thereby joining the first substrate and the second substrate to each other; and driving means for retracting the holding means from the path of the joining roller in accordance with movement of the joining roller, wherein the holding means is made up of an adsorption nozzle that adsorbs to and holds the surface on the side of center end edge in the roller forward direction in the periphery of the second substrate and a pair of adsorption nozzles that adsorb to and hold the end edge sides of the right and left sides with respect to the roller forward direction in the periphery of the second substrate, and at least one of the center adsorption nozzle and the side adsorption nozzles is moved down.

10. The substrate joining apparatus according to claim 9, wherein appropriate resistance is given to downward movement of the center latch claw and the side latch claws.

* * * * *